(12) United States Patent
Rahimo et al.

(10) Patent No.: US 7,224,008 B2
(45) Date of Patent: May 29, 2007

(54) SELF-ALIGNED PRODUCTION METHOD FOR AN INSULATED GATE SEMICONDUCTOR DEVICE CELL AND INSULATED GATE SEMICONDUCTOR DEVICE CELL

(75) Inventors: Munaf Rahimo, Uezwil (CH); Christoph Von Arx, Olten (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 10/537,834

(22) PCT Filed: Dec. 9, 2003

(86) PCT No.: PCT/CH03/00809

§ 371 (c)(1),
(2), (4) Date: Jun. 8, 2005

(87) PCT Pub. No.: WO2004/053998

PCT Pub. Date: Jun. 24, 2004

(65) Prior Publication Data

US 2006/0022261 A1    Feb. 2, 2006

(30) Foreign Application Priority Data

Dec. 10, 2002   (EP)   ................... 02406086

(51) Int. Cl.
  *H01L 29/76*   (2006.01)
  *H01L 29/94*   (2006.01)
  *H01L 31/00*   (2006.01)

(52) U.S. Cl. .............. 257/288; 257/331; 257/587; 257/E29.12; 257/E29.134; 257/E29.137; 257/E21.621; 257/E21.328; 257/E21.131; 257/E27.152

(58) Field of Classification Search .............. 257/577, 257/331, 332, 526, 370, E29.12, E29.134, 257/E29.137, E21.621, E21.328, E27.131, 257/E27.152, 288, 587
See application file for complete search history.

(56) References Cited

U.S. PATENT DOCUMENTS 5,234,851 A * 8/1993 Korman et al. ............. 438/268
5,703,383 A   12/1997 Nakayama

FOREIGN PATENT DOCUMENTS

JP   62-211955   9/1987
JP   62-229977   10/1987

* cited by examiner

*Primary Examiner*—George Fourson
*Assistant Examiner*—Julio J. Maldonado
(74) *Attorney, Agent, or Firm*—Buchanan Ingersoll & Rooney PC

(57) ABSTRACT

The invention relates to a manufacturing method for an insulated gate semiconductor device cell, comprising the steps of forming a cell window (3) in a layered structure that is located on top of a semiconductor substrate (1), forming at least one process mask that partially covers the cell window (3). In forming the cell window (3), at least one strip (41, 42) of the layered structure is left to remain inside the cell window (3) and at least one strip (41, 42) is used to serve as an edge for the at least one process mask (51, 52).

The invention further relates to an insulated gate semiconductor device, comprising a semiconductor substrate (1) having an essentially planar top surface and an insulated gate formed on the top surface by a layered structure (2) that comprises at least one electrically insulating layer (22), wherein at least one strip (41, 42) of the layered structure (2) is disposed on a third area of the top surface between an edge of the insulated gate and a first main contact (6).

2 Claims, 8 Drawing Sheets

SELF-ALIGNED PRODUCTION METHOD FOR AN INSULATED GATE SEMICONDUCTOR DEVICE CELL AND INSULATED GATE SEMICONDUCTOR DEVICE CELL

RELATED APPLICATIONS

This application claims priorities under 35 U.S.C. §119 to European Application No. 02406086.5 filed Dec. 10, 2002, and Under 35 U.S.C. §371 to PCT Application No. PCT/CH2003/000809 filed as an International Application on Dec. 9, 2003 designating the U.S., the entire contents of which are hereby incorporated by reference in their entireties.

DESCRIPTION

1. Technical Field

The invention relates to the field of semiconductor devices. It relates in particular to a method for producing an insulated gate semiconductor device and an insulated gate semiconductor device as described in the preamble of claims 1 and 7, respectively.

2. Prior Art

To manufacture a cathode in a state-of-the art insulated gate bipolar transistor (IGBT) cell, a shallow base region and a source region are normally formed in a semiconductor substrate by means of a self-aligned process, wherein the source region is disposed in a portion of the base region. This is achieved by using a poly-silicon layer, which is to serve as a gate in the future device, as a hard mask for doping steps required in forming those regions, i.e. by doping through a cell window that has to be formed in the poly-silicon layer before the doping steps are carried out. Various topologies are common for IGBT cells, characterized by a shape of the cell window, which may be linear, circular, square, etc. In general, a plurality of cells is formed on one common semiconductor substrate. However, if IGBT cells are required that have a size comparable to that of commonly available semiconductor wafers, only one single cell per semiconductor substrate may be formed. Doping is in general done by an implantation followed by a subsequent diffusion step, but may be done by diffusion and/or implantation alone or by other methods.

To provide IGBTs with an improved safe operating area (SOA), in particular for high voltage devices with ratings that exceed 2000V, a composite base region is often employed. The composite base region comprises a deep base region in addition to the shallow base region, where the shallow base region and the deep base region partially overlap one another, the deep base region being narrower and higher doped than the shallow base region, i.e. having a smaller dimension in at least one direction parallel to the poly-silicon layer. To add the deep base region, a doping mask that partially masks the cell window is therefore required. This doping mask has to be accurately aligned relative to the cell window if optimum device performance is to be achieved. Misalignment will lead to an uncontrollable shift in a threshold voltage and a potential reduction in SOA capability.

Another process step that requires accurate mask alignment is the formation of a source contact. If a contact mask is misaligned, a width of the source region between the source contact and a channel will deviate from a corresponding design value. However, if the width of the source region varies throughout the IGBT cell, a degradation of a short circuit capability will result.

DESCRIPTION OF THE INVENTION

It is an object of the invention to provide a method for manufacturing an insulated gate semiconductor device cell of the type mentioned initially that permits accurate alignment between a deep base region and/or a source contact on the one side and a source region and/or a shallow base region and/or a cell window on the other side and an insulated gate semiconductor device cell in which performance degradation due to misalignment, in particular source contact misalignment, will be reduced.

This object is achieved by a method according to claim 1 and a semiconductor device according to claim 7.

In the inventive method, a cell window is formed in a layered structure, said layered structure being disposed on a top surface of a semiconductor substrate, in such a manner that, inside the cell window, at least one strip of the layered structure remains. For subsequent process steps that require partial masking of the cell window, at least a first process mask is formed in such a way that at least one first strip acts as a first edge for said first process mask. This has the advantage that a position of a first process mask edge for the at least one additional subsequent process step is accurately defined relative to the cell window. Favorably, at least one additional layer, in particular an oxide layer or a primer for adding the process mask, may be disposed so that it at least partially covers the at least one strip and/or a main portion of the layered structure surrounding the cell window before the process mask is added.

In a preferred variation of the inventive method, at least a first strip is formed as isolated strip, i.e. is not in touch with a main portion of the layered structure surrounding the cell window. If the layered structure comprises at least one electrically conducting layer, no electrical connection will therefore remain between a first, main portion of the electrically conducting layer that surrounds the cell window and a second portion of the electrically conducting layer comprised by the first strip. The second portion of the electrically conducting layer will therefore not be electrically active when the device is in operation. This has the advantage of improving process sensitivity for potential gate-emitter short problems during a subsequent etch step required for a formation of an emitter contact when manufacturing IGBT cells.

In a preferred variation of the inventive method, the first process mask serves as a doping mask for adding a deep base region. The deep base region is formed by doping with the doping mask present, with dopants of a first conductivity type, preferably by implantation with subsequent diffusion. This has the advantage that the deep base region is accurately aligned relative to the first strip. Preferably, the doping mask is subsequently removed and a shallow base region and a source region is formed in subsequent process steps, preferably by implantation with subsequent diffusion of dopants of the first and of a second conductivity type, respectively. The deep and shallow base regions and the source region will thus be accurately aligned relative to one another.

In another preferred embodiment of the inventive method, the first process mask serves as a contact mask. A source region is added by doping through the cell window with dopants of the second conductivity type before the contact mask is formed. A first main contact is then formed by etching through the source region once the contact mask is in place. Accurate alignment of the first main contact within the cell window results.

In another preferred variation of the inventive method, the first process mask serves as doping mask. After removal of the first process mask and a number of intermediate process steps, a second process mask is added in such a way that the strip again acts as an edge for said second process mask, which preferably serves as contact mask.

In another preferred variation of the method according to the invention, one or more, preferably all, strips are removed in a subsequent process step.

In the inventive semiconductor device according to claim 7, at least one strip of a layered structure is disposed on a third area of a top surface of a semiconductor substrate between a gate edge and a first main contact. This has the advantage that a degradation of short circuit capabilities resulting from potential misalignment of the first main contact relative to the gate edge will be reduced compared to a state of the art semiconductor device.

In a preferred embodiment of the inventive semiconductor device, a second portion of an electrically conducting layer of the layered structure, said second portion of the electrically conducting layer being comprised by the at least one strip, is electrically connected to a first main contact. This way, a degradation of short circuit capabilities resulting from misalignment can be eliminated completely.

Further advantageous realizations can be found in the dependent claims.

BRIEF EXPLANATION OF THE FIGURES

The invention will be explained in more detail in the following text with reference to exemplary realizations and in conjunction with the figures, in which.

The reference signs used in the figures are explained in the list of reference signs. In principle, identical reference symbols are used to denote identical parts.

APPROACHES TO REALIZATION OF THE INVENTION

Figure 1:
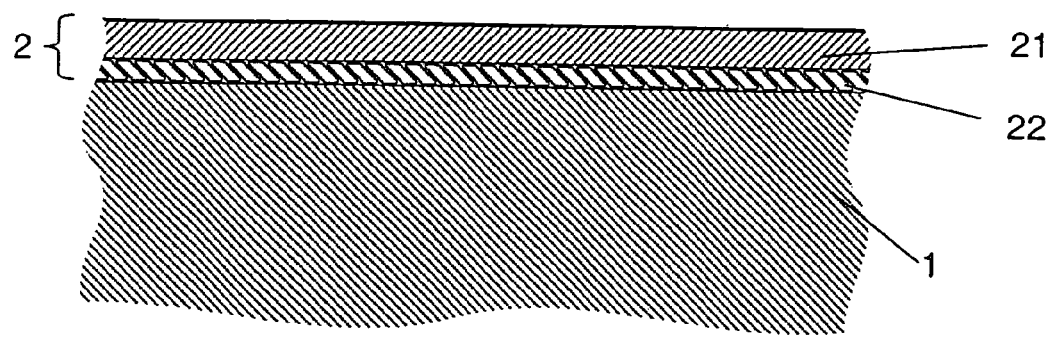
FIG. 1 shows a cross section of a semiconductor substrate with a layered structure disposed on a top surface.
Figure 2:
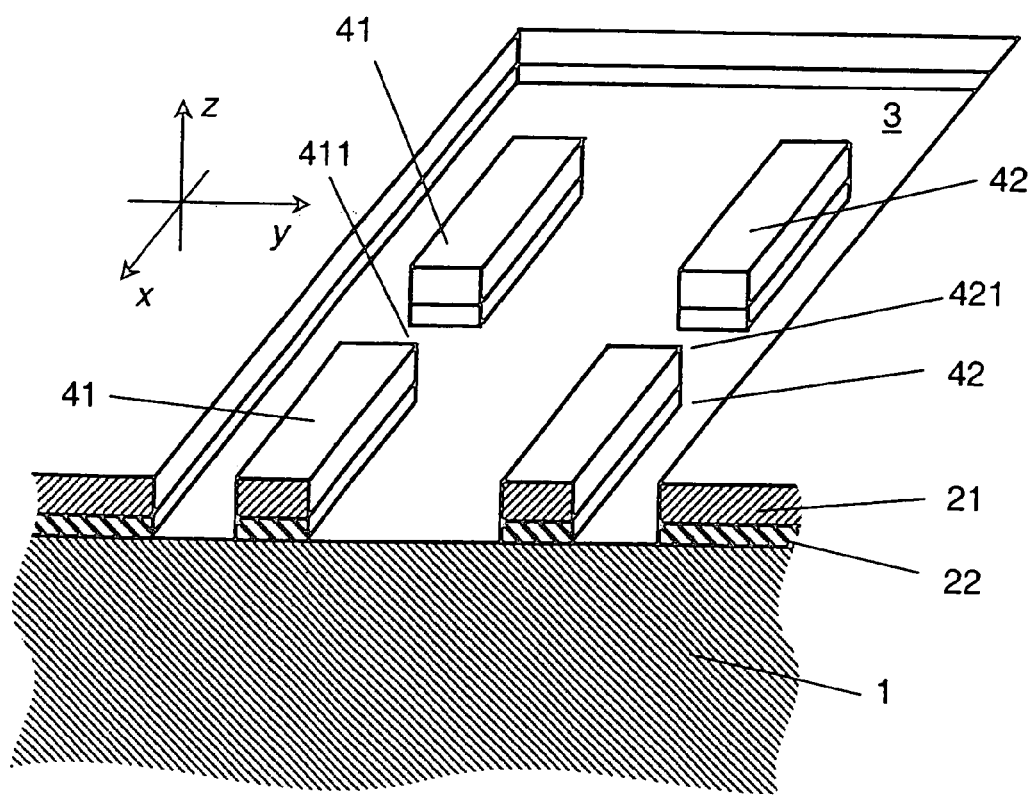
FIGS. 2, 3, 4 and 5 illustrate how to manufacture an IGBT cell cathode.

FIG. 1a shows a cross section of an n-doped semiconductor substrate 1. A layered structure 2 comprising an oxide layer 22 and a poly-silicon layer 21 was disposed on a top surface of the semiconductor substrate 1. FIGS. 2, 3, 4 and 5 illustrate how to manufacture an IGBT cell cathode in the semiconductor substrate 1: In a first step, a cell window 3 is generated in the layered structure 2 as shown in a perspective representation in FIG. 2 and in cross-section in FIG. 3a. Standard methods known to a person skilled in the art of photolithography are preferably used to remove the layered structure 2 where desired. The cell window 3 is formed in such a way that a first row of isolated strips 41 and a second row of isolated strips 42 of the layered structure 2 remain inside the cell window 3, so that at least one opening 411 and 421 results within each row. A second portion of the poly-silicon layer 21 comprised by the isolated strips 41, 42 is not electrically connected to a first, main portion of the poly-silicon layer 21 that surrounds the cell window 3, and will therefore not be electrically active when the device is in operation. This has the advantage of improving a process sensitivity for potential gate-emitter short problems during a subsequent contact etch.

Figure 3A:
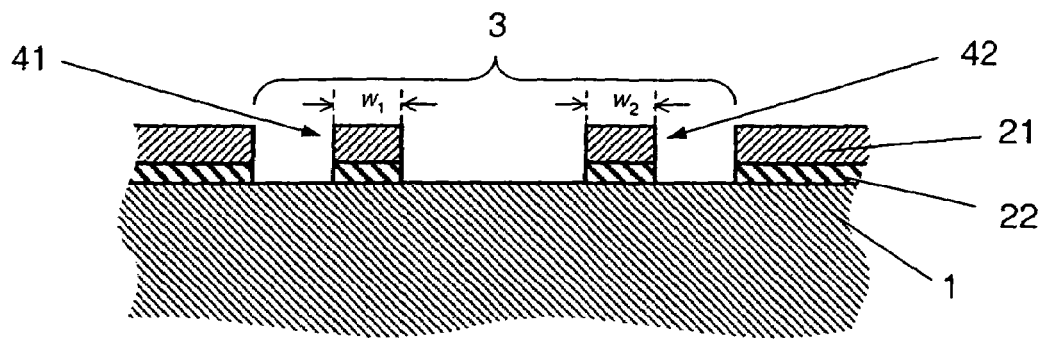
Figure 3B:
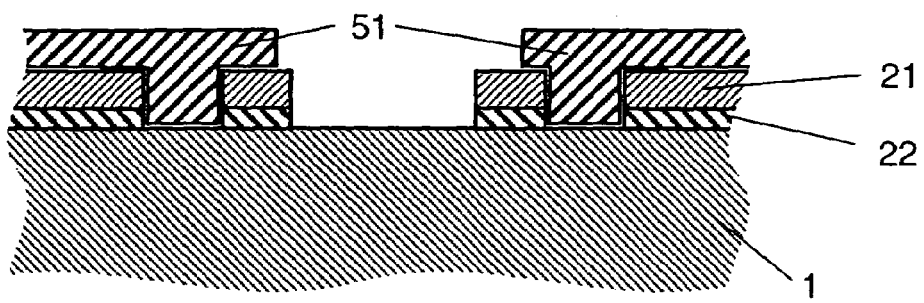
Figure 3C:
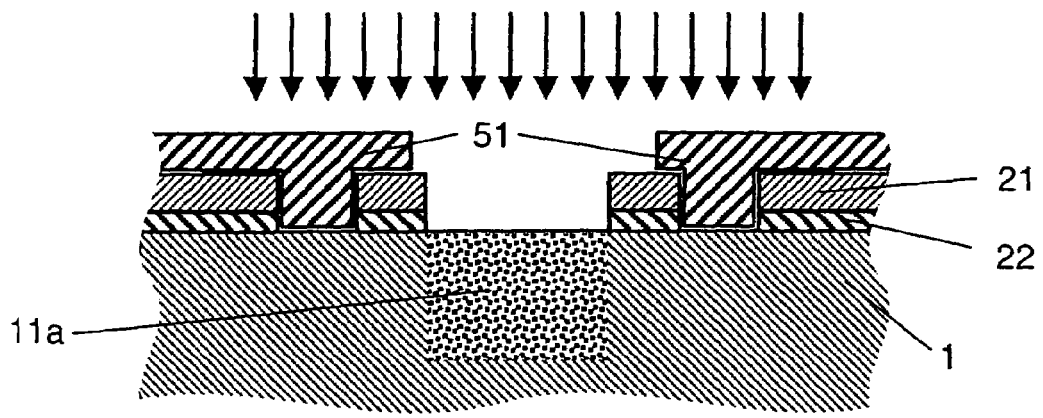
Figure 3D:
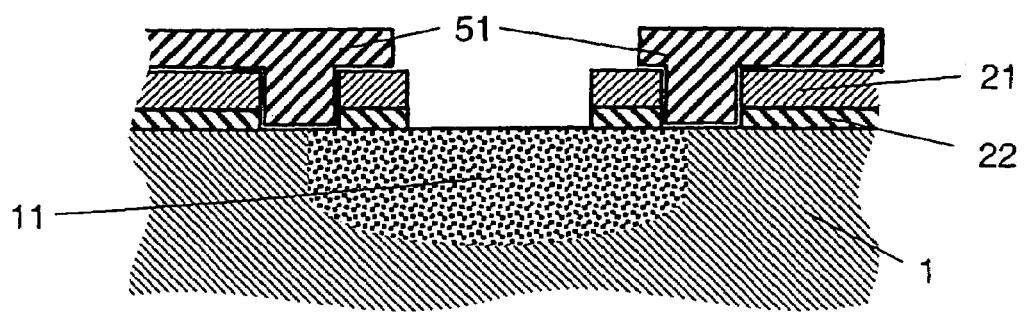

A first process mask 51, typically photoresist, is then formed so that said first process mask 51 partially covers the cell window 3, and at least partially covers each of the strips 41 and 42 as shown in FIG. 3b. Widths $w_1$ and $w_2$ are preferably bigger than a typical uncertainty in the position of the process mask 51, i.e. $w_1$ and $w_2$ measure preferably a few micrometers, preferably 2 to 3 micrometers. A deep $p^+$-base region 11 as shown in FIG. 3d is then formed by a first ion implantation step and a subsequent first diffusion step of dopants of a first conductivity type, e.g. Boron. This will provide the resulting IGBT cell with good safe operating area (SOA) capabilities. During the ion implantation step, the strips 41, 42 act as a process mask edge. A resulting first implantation profile 11a as shown in FIG. 3c is therefore laterally confined by the strip position. The first process mask 51 can now be removed for further processing steps.

Figure 4A:
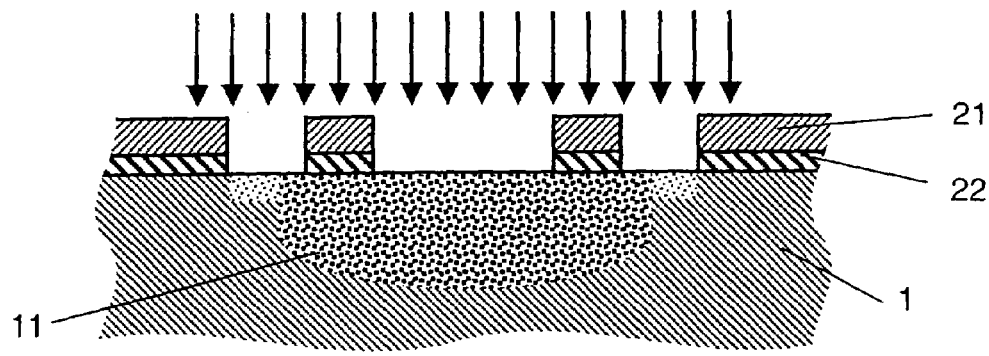
Figure 4B:
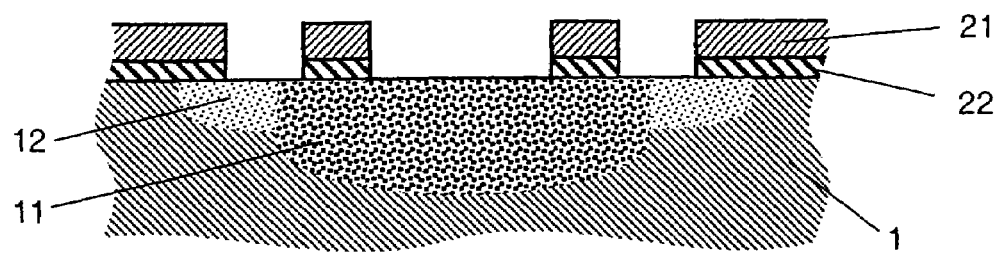
Figure 4C:
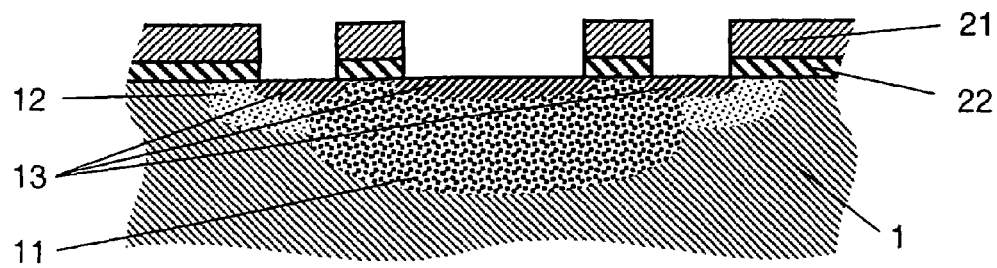

Additional processing steps are required to complete the IGBT cell. A shallow p-base region 12 with dopants of the first conductivity type as shown in FIG. 4b is added, again by a second implantation step, resulting in a second implantation profile 12a as shown in FIG. 4a. This time, implantation is done over the whole cross section of the cell window 3. After a second diffusion step, the shallow p-base region 12 results. In a subsequent step, an $n^+$-source region 13 with dopants of a second conductivity type, e.g. Arsenic or Phosphorus as shown in FIG. 4c is added preferably by a third implantation step followed by a third diffusion step.

Figure 5A:
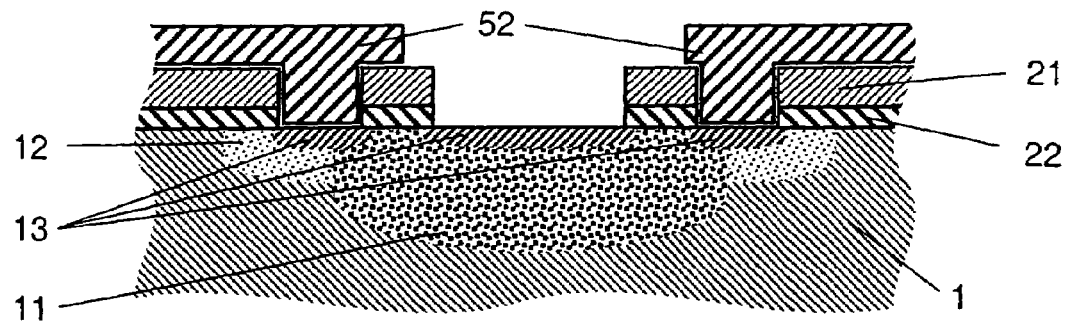
Figure 5B:
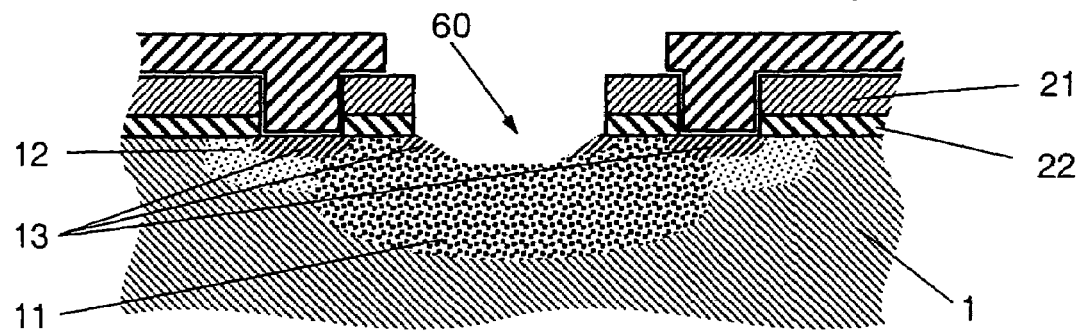
Figure 5C:
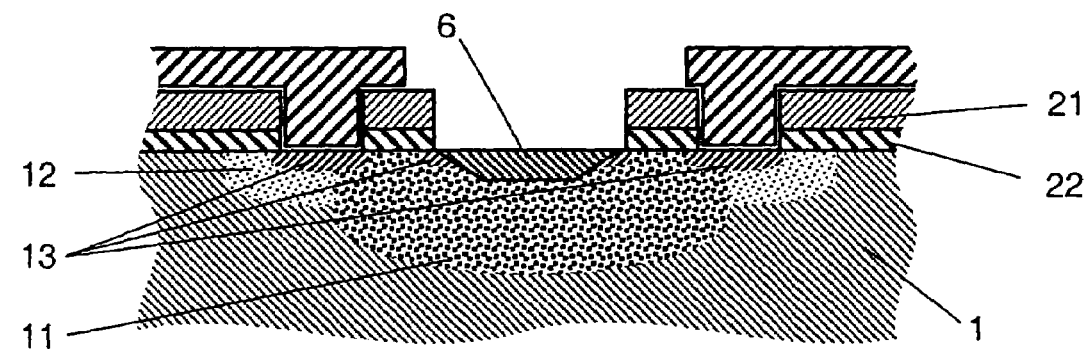
Figure 5D:
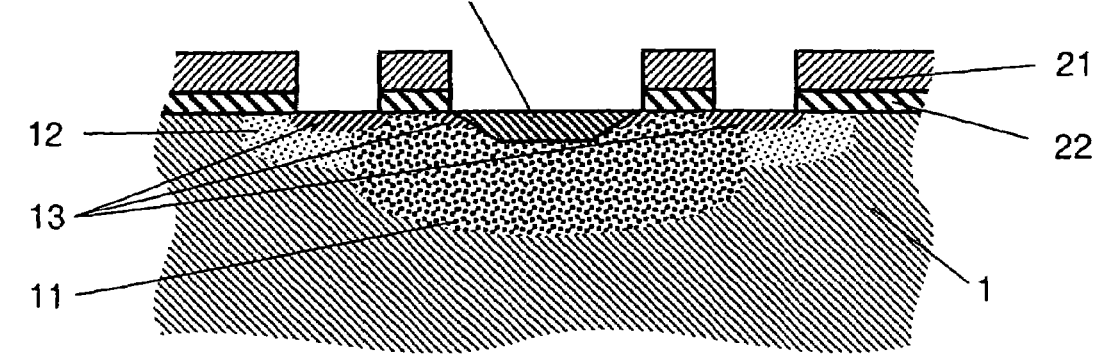

In a preferred embodiment of the invention, a second process mask 52 is then formed as shown in FIG. 5a. In a subsequent contact etch step, the second process mask 52 serves as a contact mask, with the strips 41 and 42 again acting as mask edges. An emitter contact 6 is formed by etching through the $n^+$-source region 13 in an area between the strips 41 and 42, as shown in FIG. 5b, and by filling a resulting contact well with metal, so that a good electrical connection is established between the emitter contact 6 and the deep p+-base region 11.

Figure 6:
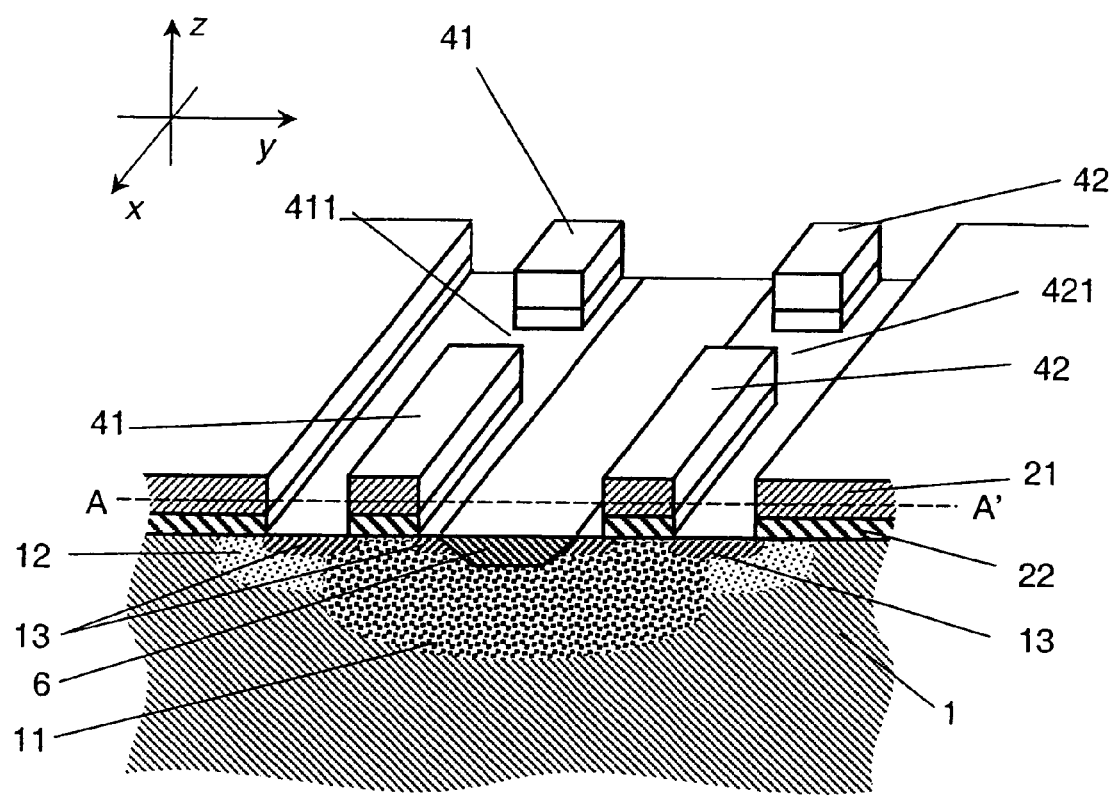
FIG. 6 shows a IGBT cell cathode resulting from the manufacturing process shown in FIGS. 2 through 5.
Figure 7A:
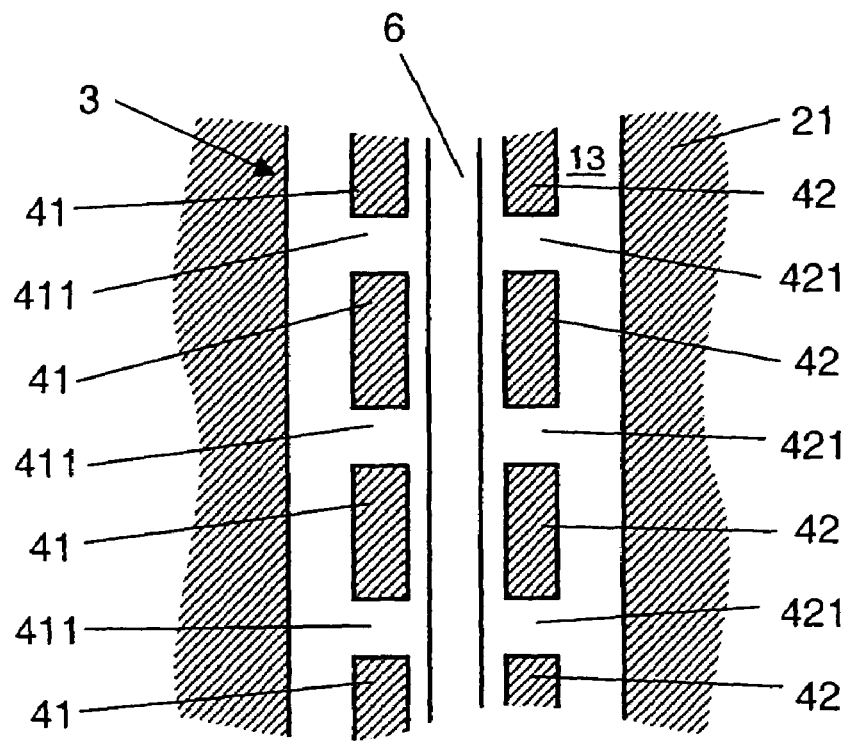
FIG. 7 shows a cut through the structure shown in FIG. 6, and FIGS. 8 and 9 show an insulated gate semiconductor device according to the invention.
Figure 7B:
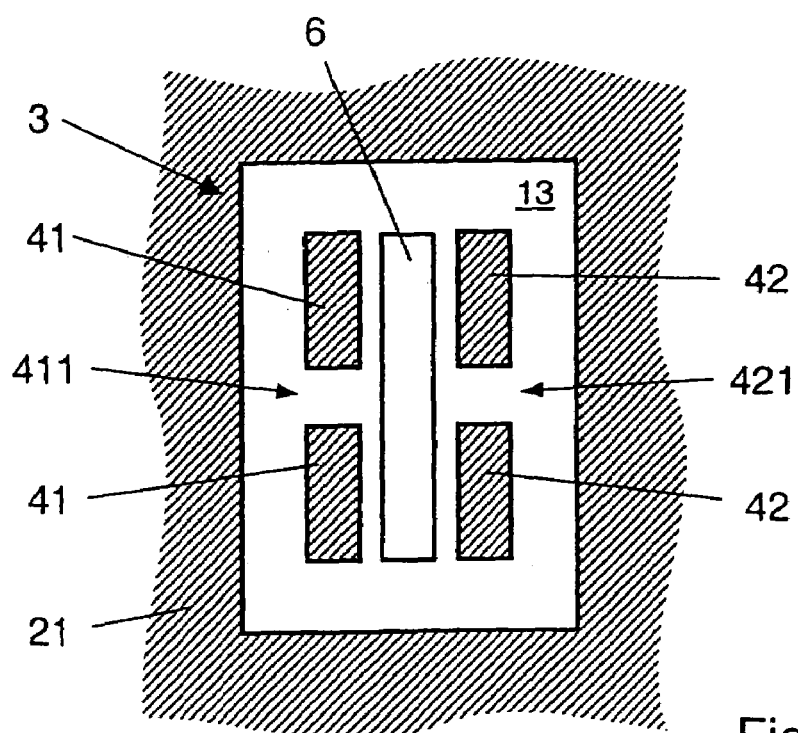

A IGBT cell cathode resulting from the manufacturing process described above in connection with FIGS. 2 through 5 is shown in FIG. 6. The structure shown is a so-called mini-strip design. FIG. 7a shows a cut through the structure of FIG. 6, along the line A–A' and perpendicular to the z-axis. An alternative design, a so-called full-strip design is shown in FIG. 7b. The openings 411 and 421 ensure that an outer portion of the n+-source regions 13 located between each of the strips 41, 42 and the first, main portion of the layered structure 2 surrounding the cell window 3 are electrically connected to the emitter contact 6 via a distributed resistance that is in series with the emitter contact 6, as known from emitter ballasting. The ration of the openings to the full strip lengths is an important factor in the design of a IGBT cell. The basic idea behind this approach is that if an emitter current increases locally, the voltage drop across an emitter ballast resistance will also increase, which in turn will reduce the emitter current and divert the emitter current to other regions of the n+-source region 13. This has the advantage that it promotes a more uniform current distribution.

In another preferred embodiment of the invention, an electrical connection is established between the emitter contact 6 and the second portion of the poly-silicon layer 21 comprised by the strips 41, 42. This is preferably achieved by also etching away such portions of the strips 41, 42 that are not covered by the contact mask 52 during the contact etch step, and choosing a thickness of the emitter contact 6 appropriately.

In another preferred embodiment of the invention, the strips 41 and 42 are removed by a dry-etch step after the deep p$^+$-base region 11 has been formed. A dry-etch mask is formed on those portions of the poly-silicon layer 21 that are not to be removed by the dry-etch step, in particular the first, main portion of the poly-silicon layer 21 surrounding the cell window 3, i.e. the future gate regions. This is of particular advantage in another preferred variant of the method according to the invention, in which the cell window 3 in the layered structure is formed in such a manner that the strip that remains forms a closed loop, which may, e.g., be rectangular, circular, hexagonal, etc.

Figure 8:
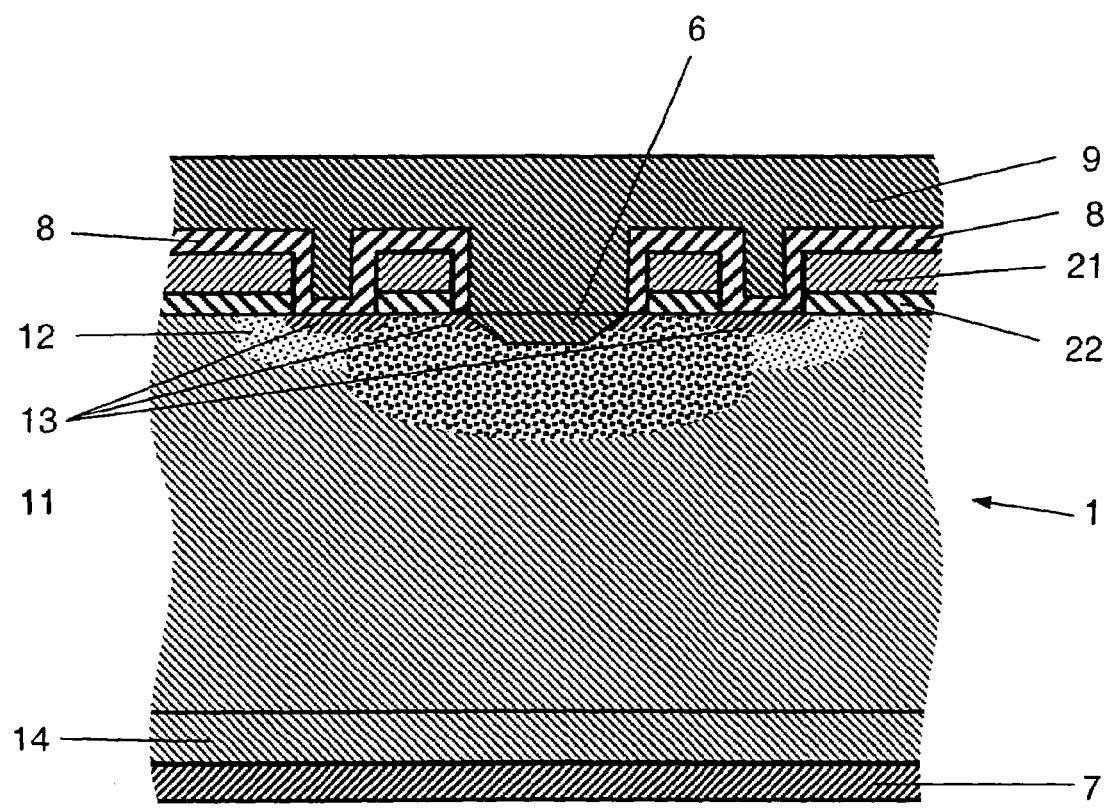
Figure 9:
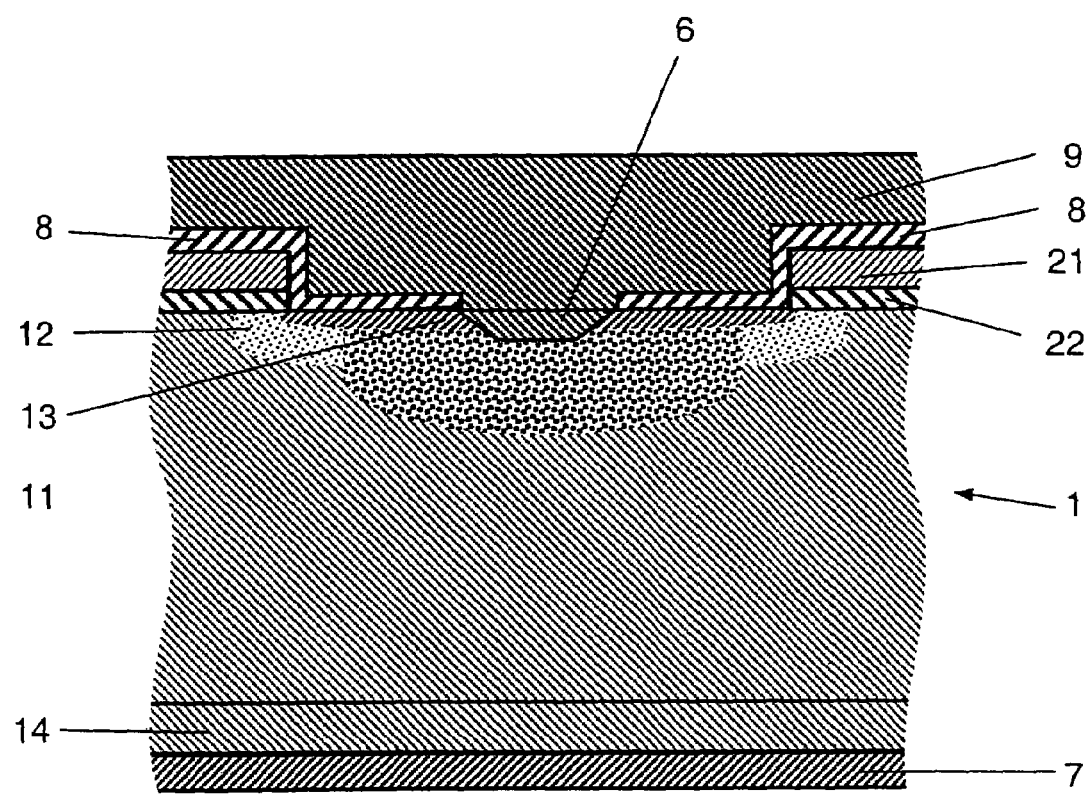

A vertical cut through an insulated gate semiconductor device according to the invention is shown in FIG. 8. The device represents an IGBT structure, with a p-doped anode region 14 formed on the bottom of the semiconductor substrate 1, said p-doped anode region 14 being electrically connected to an anode electrode 7. A low temperature oxide layer 8 is disposed on top of and around the poly-silicon layers 21, electrically insulating poly-silicon layer 21 from the emitter metallization 9. In this embodiment, there is no electrical connection between the strips 41, 42 of the second portion of the poly-silicon layer 21 and either the emitter metallization 9 or the emitter contact 6. Another vertical cut through one of the openings in the strips of the semiconductor device according to the invention is shown in FIG. 9.

In a preferred embodiment of the semiconductor device according to the invention an electrical connection exists between the second portion of the poly-silicon layer 21 being comprised by the strips 41, 42 and the emitter metallization 9 and the emitter contact 6.

LIST OF REFERENCE SIGNS

1 Semiconductor substrate
11 First doped region, deep p$^+$-base
11a First implantation profile
12 Second doped region, shallow p-base
12a Second implantation profile
13 Third doped region, n$^+$-source
14 p-doped anode region
21 Electrically conducting layer, polysilicon layer
22 Electrically insulating layer
3 Cell window
41, 42 First, second strips
411, 421 First, second opening
51 First process mask, doping mask
52 Second process mask, contact mask
6 First main contact, emitter contact
7 Anode metallization
8 Low temperature oxide
9 Cathode metallization

The invention claimed is:

1. An insulated gate semiconductor device, comprising
   a layered structure on a planar cathode side of a semiconductor substrate, said layered structure being arranged around a cell window and forming an insulated gate comprising an oxide layer on top of said semiconductor substrate and a polysilicon layer on top of said oxide layer,
   a first doped region of a first conductivity type extending into the substrate beneath the center of said cell window,
   a second doped region of a first conductivity type, comprising a shallow base region, extending into the semiconductor substrate beneath the outer edge of the cell window adjacent said first doped region;
   at least one third doped region of a second conductivity type, comprising a source region, extending partially into said second doped region adjacent said first doped region; and
   a first main contact disposed on the top surface electrically connected to said first doped region and said third doped region;
wherein
   at least two isolated strips are arranged in the cell window between the insulated gate and the first main contact, dividing the cell window in an outer cell window region and an inner cell window region, said outer cell window region being located between the isolated strips and insulated gate and above the third doped region, and said inner cell window region being located between the isolated strips and comprising the main contact, said strips comprising an oxide layer on top of the semiconductor substrate and a poly-silicon layer on top of the oxide layer, wherein
   the two strips comprise openings, and wherein
   the third doped region beneath the outer cell window region is electrically connected to the first main contact.

2. An insulated gate semiconductor device as in claim 1, wherein
   the ratio length of openings to lengths of strips is laid out to match a desired emitter ballast resistance.

* * * * *